United States Patent
Lin et al.

[11] Patent Number: 6,150,215
[45] Date of Patent: Nov. 21, 2000

[54] AVOIDING ABNORMAL CAPACITOR FORMATION BY AN OFFLINE EDGE-BEAD RINSING (EBR)

[75] Inventors: Kuo-Chi Lin, Lu-Chou; Da-Wen Hsia, Taipei, both of Taiwan

[73] Assignee: United Microelectronics Corp., Hsin-Chu, Taiwan

[21] Appl. No.: 09/371,415

[22] Filed: Aug. 10, 1999

[51] Int. Cl.[7] .............................................. H01L 21/8242
[52] U.S. Cl. .................................................................. 438/253
[58] Field of Search ..................................... 438/253, 239, 438/243, 245, 250, 251, 254, 624, 625, 626, 699, 695, 692, 689, 713, 694

[56] References Cited

U.S. PATENT DOCUMENTS 5,783,482  7/1998  Lee et al. ................................. 438/624

*Primary Examiner*—Charles Bowers
*Assistant Examiner*—Craig Thompson
*Attorney, Agent, or Firm*—Harness, Dickey & Pierce, P.L.C.

[57] ABSTRACT

A method for ensuring no capacitor peeling at the edge of a wafer in the fabrication of dynamic random access memory (DRAM) is disclosed. The method includes first providing a semiconductor substrate having a semiconductor structure formed thereon. A dielectric layer is then formed overlying the semiconductor structure, and patterned for defining a contact window. Followed by, the deposition of a silicon layer over the dielectric layer that fills up the contact window. Consequentially, a photoresist layer is coated overlying the silicon layer, where it will be rinsed twice by a combination of an online EBR (and/or a WEE) and an offline EBR at a distance inwardly away from the edge of the wafer in process for removing a portion of the photoresist to avoid abnormal capacitor formation in later stages. Then, a photolithography process is carried out against the photoresist layer to form a photoresist mask. Finally, the silicon layer is etched where it is not covered by the photoresist mask to form a lower capacitor electrode. The photoresist mask is stripped as to conclude the present invention.

28 Claims, 12 Drawing Sheets

AVOIDING ABNORMAL CAPACITOR FORMATION BY AN OFFLINE EDGE-BEAD RINSING (EBR)

BACKGROUND OF THE INVENTION

1. Field of the Invention

The present invention relates to the fabrication of integrated circuit devices, and more particularly, to a method for preventing abnormal capacitor formations by introducing an offline edge-bead rinsing (EBR) in the fabrication of dynamic random access memory (DRAM).

2. Description of the Prior Art

Manufacturing of semiconductor substrates encompasses hundreds of different process steps. The steps involve creating patterns, introducing dopant, and depositing films on a silicon substrate repetitively throughout the manufacturing process to form integrated structures. Because the various structures that are built on a substrate or a wafer are serial in nature, that is, that they are built one on top of another in a sequential manner, it becomes very important that each layer of structure is substantially defect free before the next one is placed thereon.

Defects are generally caused when an unwanted particulate matter unintentionally lands between features on a layer and "bridges" or connects them, and therefore, disables them by "shorting" under certain conditions; or when an unwanted particulate matter lands on a feature, and disables it by creating an unwanted "open" in the circuitry; or when an abnormal capacitor forms and collapses during a DRAM fabrication. Normally, as each layer is deposited and then essentially trimmed back from the edge of the wafer through a judicious use of mask and etching, and/or edge-bead rinsing (EBR) and later sealed by wafer edge exposure (WEE). The abnormal structures of capacitors are still formed at the edge of wafers that later peel or break up to form particulate matter and fine dust.

FIG. 1A illustrates a semiconductor structure formed over a silicon substrate 10. The semiconductor structure comprises a bit line 12, a gate electrode 14, a source/drain region 16, and an isolation region 18. Furthermore, there formed a dielectric layer 20 in between the semiconductor structure and a conductive layer 22. An abnormal photoresist mask 24 having gradually decreased pattern is formed on top of the conductive layer 22 after an online EBR and/or a WEE process. A portion of the conductive layer that is not covered by the photoresist mask is then etched to form a lower capacitor electrode 26 and to expose a portion of the dielectric layer 20, like what is shown in FIG. 2B. Wherein, capacitor 26A and 26B are normal patterns, capacitor 26C and 26D are abnormal patterns with decreased in width. These abnormal capacitors are easy to peel off and collapse, eventually ending up with the worst situation shown in FIG. 1C, where capacitor 26C and 26D are collapsed toward capacitor 26B. Hence, the overall DRAM fabrication ends up with defects in DRAM cells and a drop-off in yield.

SUMMARY OF THE INVENTION

In accordance with the present invention, a method is provided for forming lower capacitor electrodes in fabricating integrated circuit devices that substantially prevents the formation of abnormal capacitors. In the standard photo rule, the wafer edge rule of photo is inline EBR and/or WEE. However, there are always abnormal lower capacitor electrodes with the current photo rule. The abnormal lower capacitor electrodes mean having smaller width than the normal ones. Since the lower capacitor electrode is high and its width is small when the DRAM size is becoming small, that is, the aspect ratio of the lower capacitor electrode is large.

The abnormal lower capacitor electrodes are found easy to peel off and collapse. Therefore, in one embodiment of the present invention, an offline EBR is introduced to clear the abnormal lower capacitor formations. Hence, no more capacitor peeling and collapsing, and the yield is improved by a great amount.

The method of the embodiment of the present invention comprises: firstly, providing a substrate having a semiconductor structure formed thereon; forming an insulating layer overlying the semiconductor structure; then, patterning the insulating layer to define a contact window; depositing a conductive layer over the insulating layer and filling up the contact window; coating a photoresist layer overlying said conductive layer; follows by, removing a first portion of the photoresist in between the edge of the wafer and a first distance inwardly away from the edge of the wafer; as well as, removing a second portion of the photoresist in between the edge of the wafer and a second distance inwardly away from the edge of the wafer, wherein the second distance is greater than the first distance; next, carrying out a photolithography process against the photoresist layer to form a photoresist mask; etching the conductive layer where it is not covered by the photoresist mask to form a lower capacitor electrode; and finally, removing the photoresist mask.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 2A to FIG. 2I depicts the process flow of a preferred embodiment according to the present invention in cross-sectional views.

DESCRIPTION OF THE PREFERRED EMBODIMENT

Referring to FIG. 2A–2I, the process flow of a preferred embodiment according to the present invention is depicted in cross-sectional views. These drawings merely show several key steps in sequential processes.

Figure 1A:
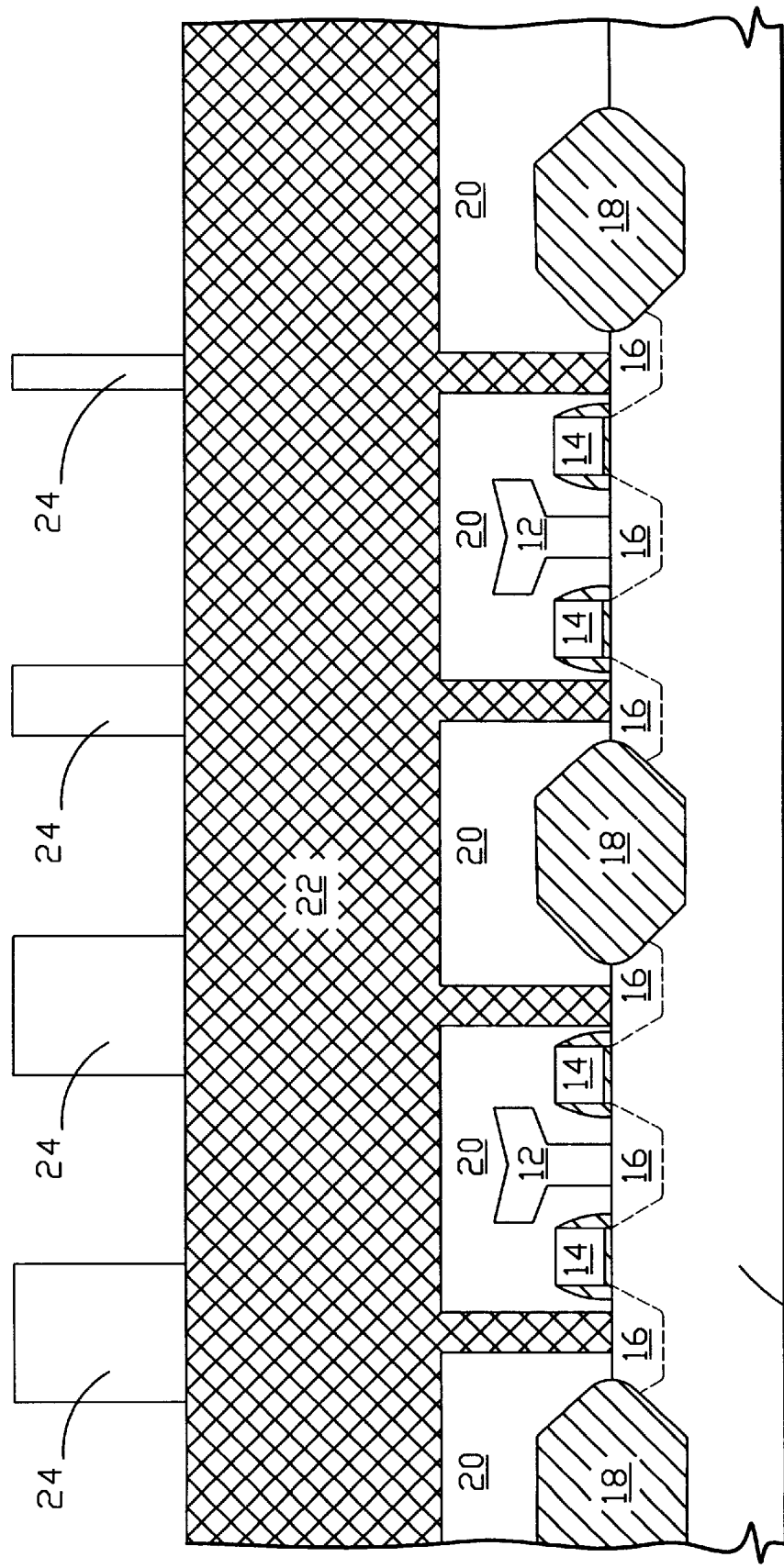
FIG. 1A is a cross-sectional view of a semiconductor structure having a conventional abnormal photoresist mask after an online EBR and/or a WEE process.
Figure 1B:
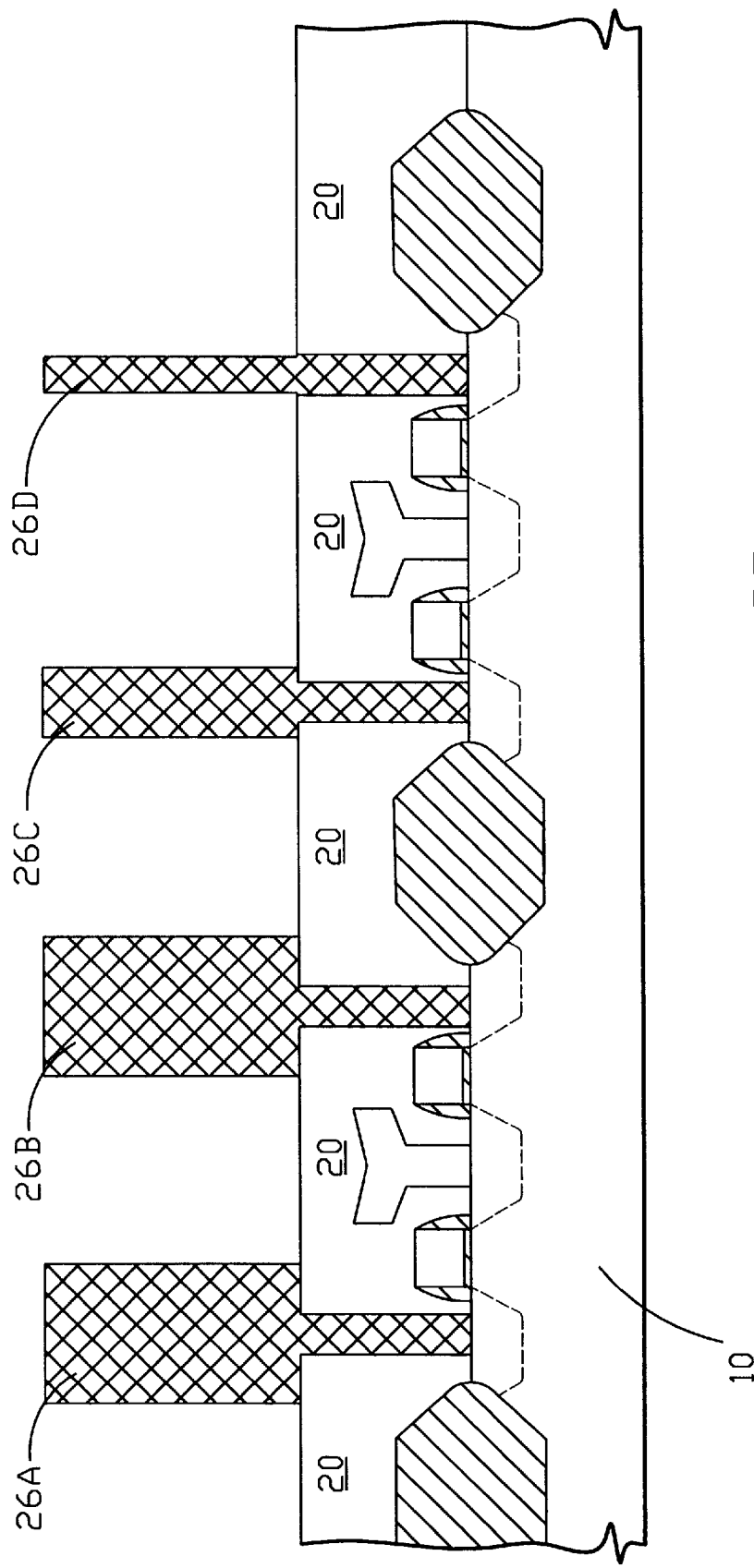
FIG. 1B is a cross-sectional view of a semiconductor structure having a conventional abnormal capacitor pattern been formed by using the abnormal photoresist mask.
Figure 1C:
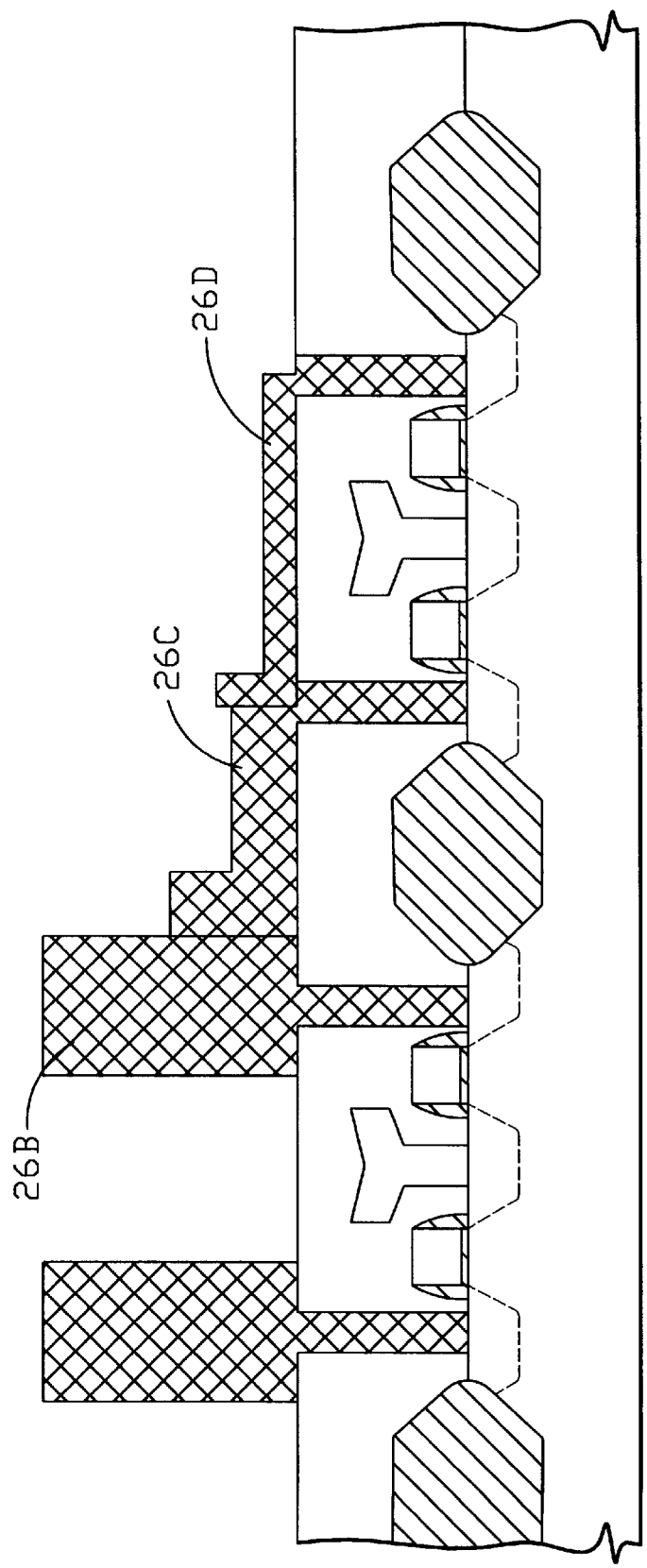
FIG. 1C is a cross-sectional view of a semiconductor structure having collapsed capacitors.
Figure 2A:
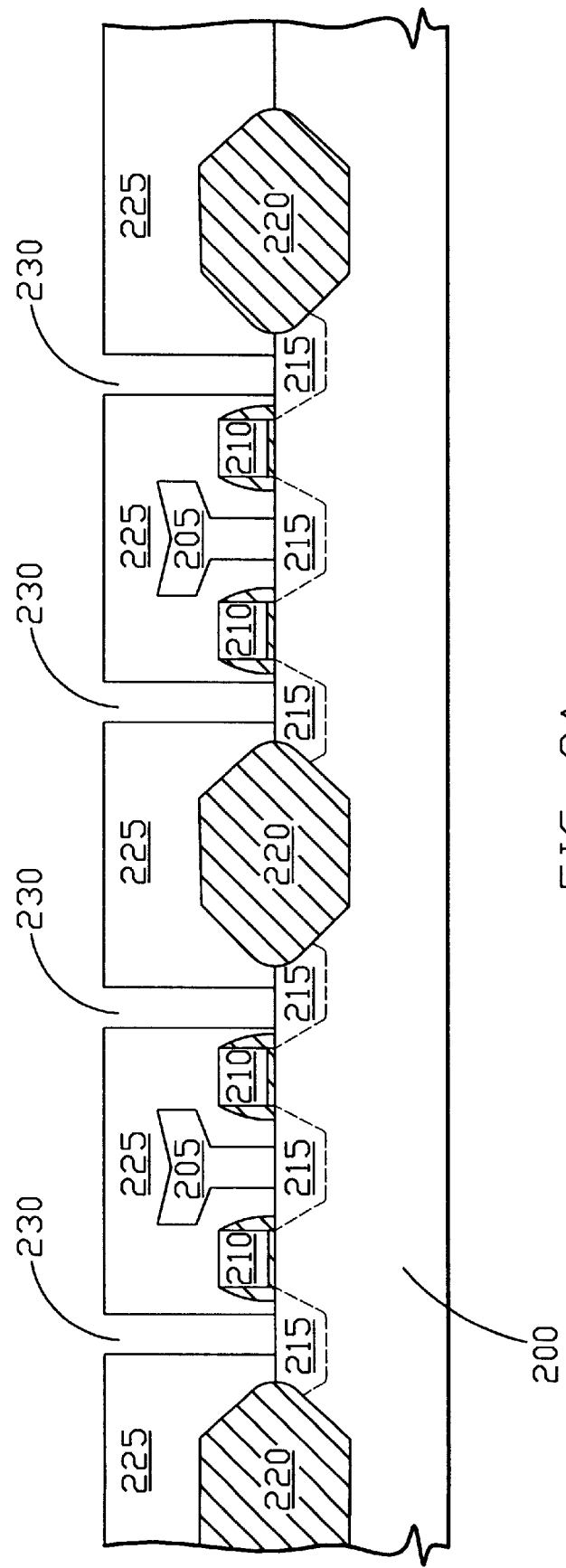

Firstly, in FIG. 2A, a semiconductor substrate 200, preferably silicon, having a semiconductor structure formed thereon is provided. The semiconductor structure comprises a bit line 205, a gate electrode 210, a source/drain region 215, and an isolation region 220. The steps of forming the gate electrode and the bit line, doping through windows opened by the previous steps of patterning, annealing to form the source/drain region for a MOSFET device, all accomplished according to well known semiconductor processing techniques. These techniques will not be described in detail here in order not to unnecessarily obscure the present invention. A dielectric layer 225, preferably composed silicon dioxide (SiO$_2$), is then formed overlying the entire exposed surface of the semiconductor structure. Subsequently, a photolithography process is enforced against the dielectric layer for defining a contact window 230 and exposing a portion of the source/drain region. The contact windows are later used as contact paths between lower capacitor electrodes and source/drain regions 215.

Figure 2B:
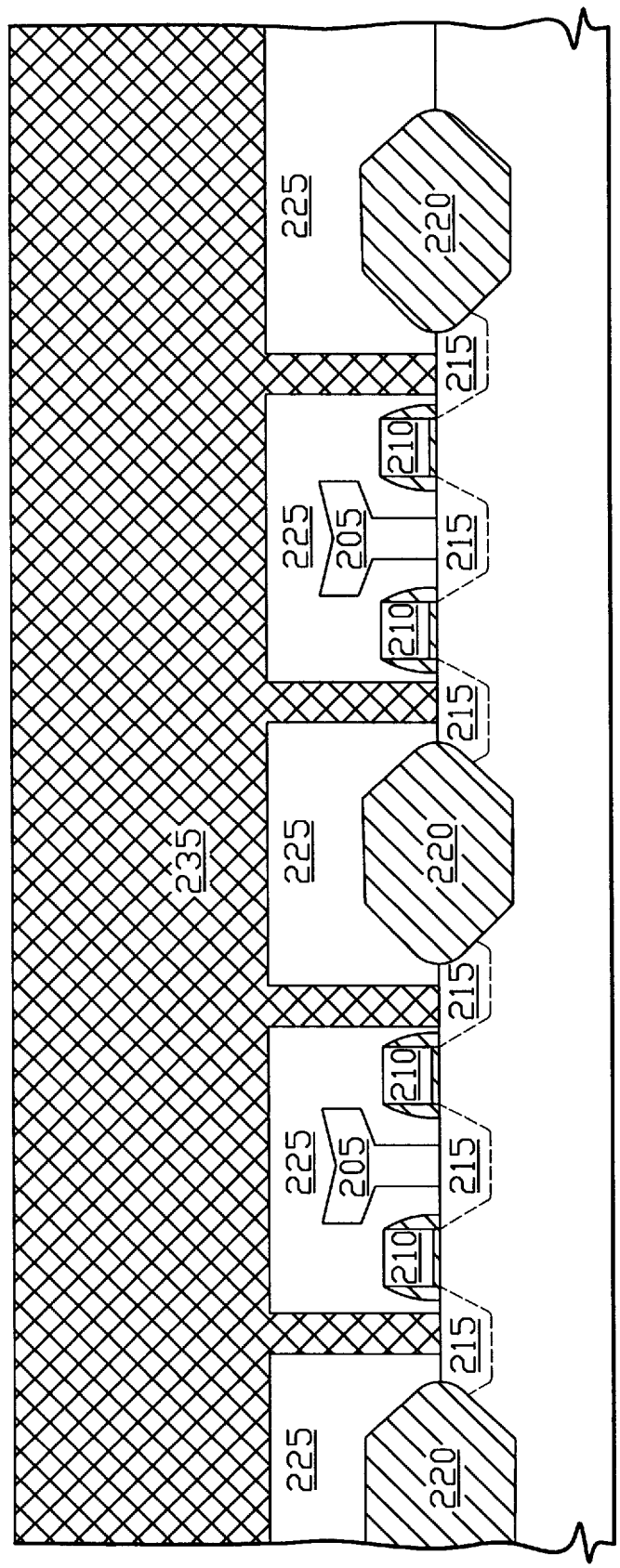
Figure 2C:
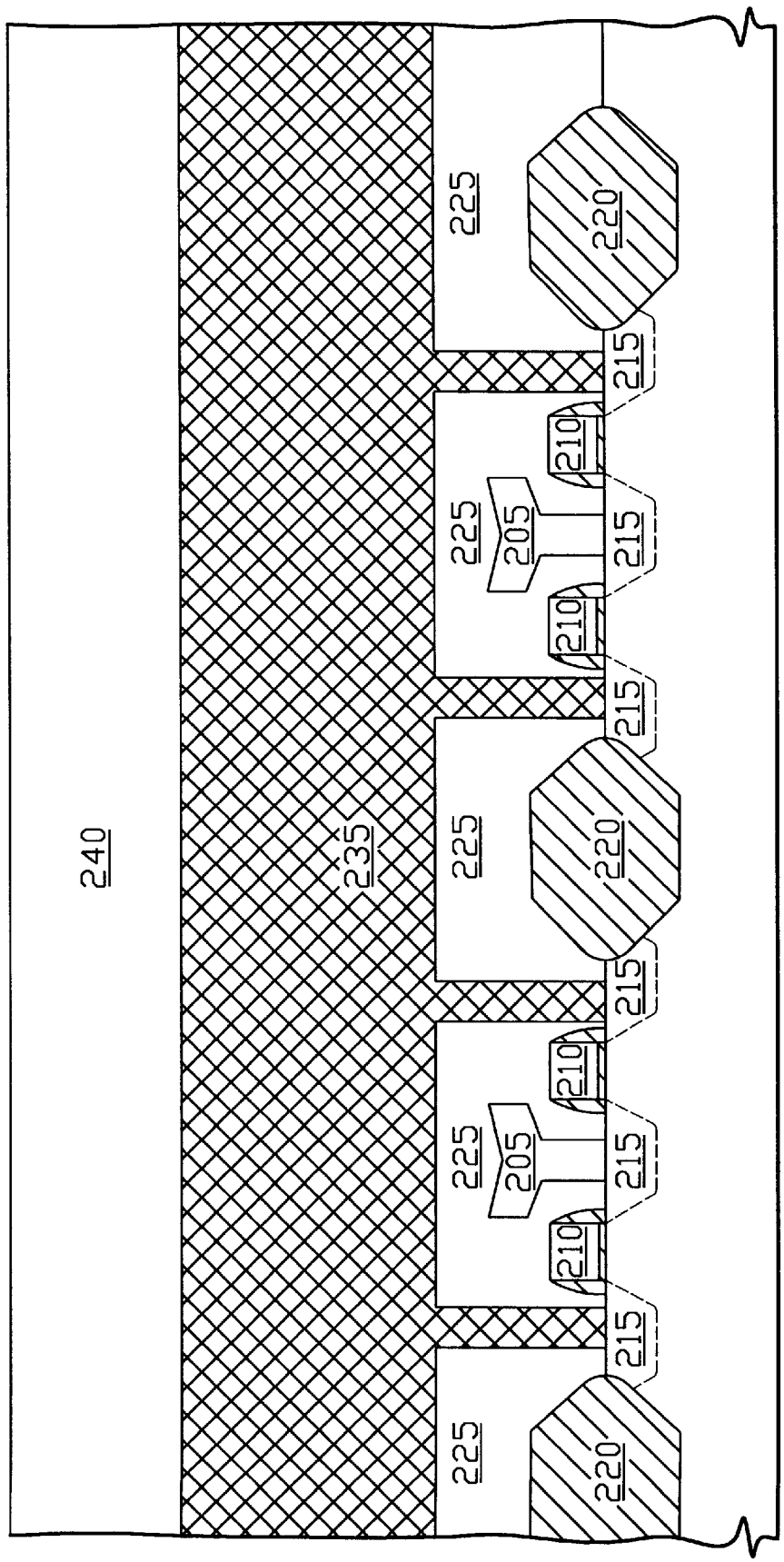
Figure 2D:
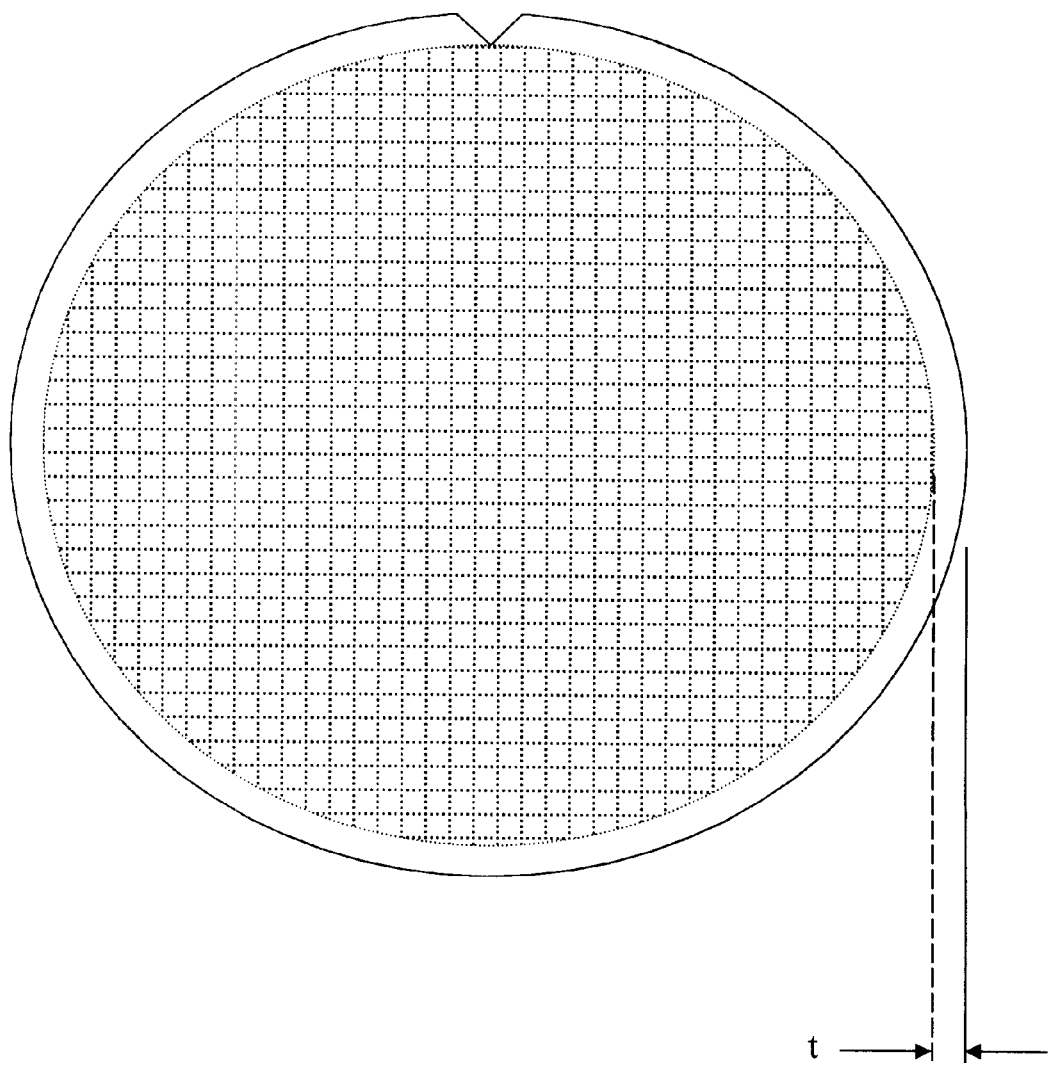

Next, in accordance with FIG. 2B, a silicon layer 235 is deposited over the dielectric layer 225 and filled up the contact window as well. The silicon layer consists of either polysilicon or amorphous-silicon, regardless of which, it is formed by using chemical vapor deposition to a thickness greater than about 8000 angstroms. Ideally, amorphous-Si is transformed into polycrystalline-Si at a transition temperature ranging from about 575. degree. C. to about 650. degree. C. Soon after the deposition of the silicon layer, a photoresist layer 240 is coated over the silicon layer 235 by using the spin coating method, as illustrated in FIG. 2C.

Figure 2E:
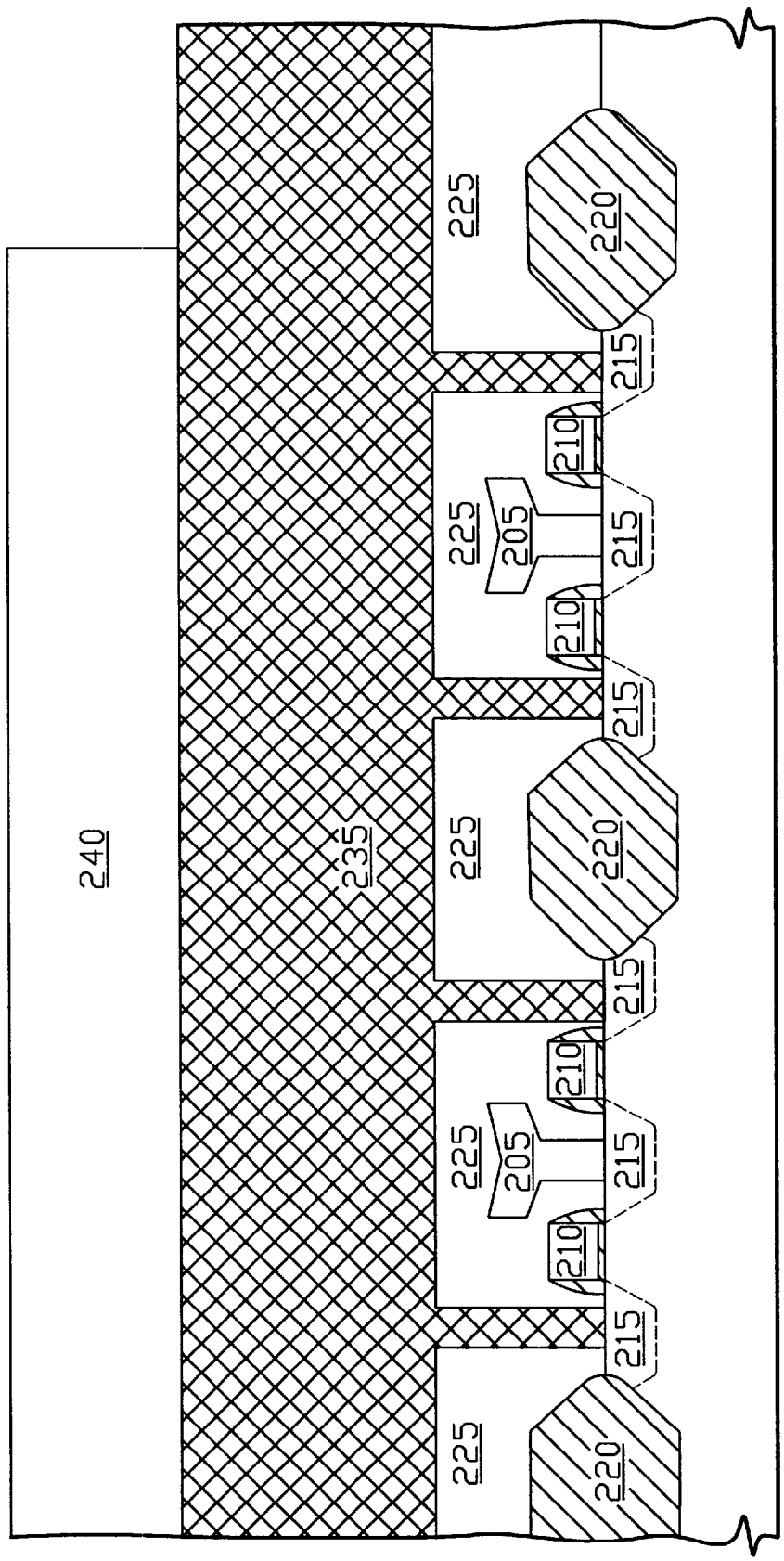
Figure 2F:
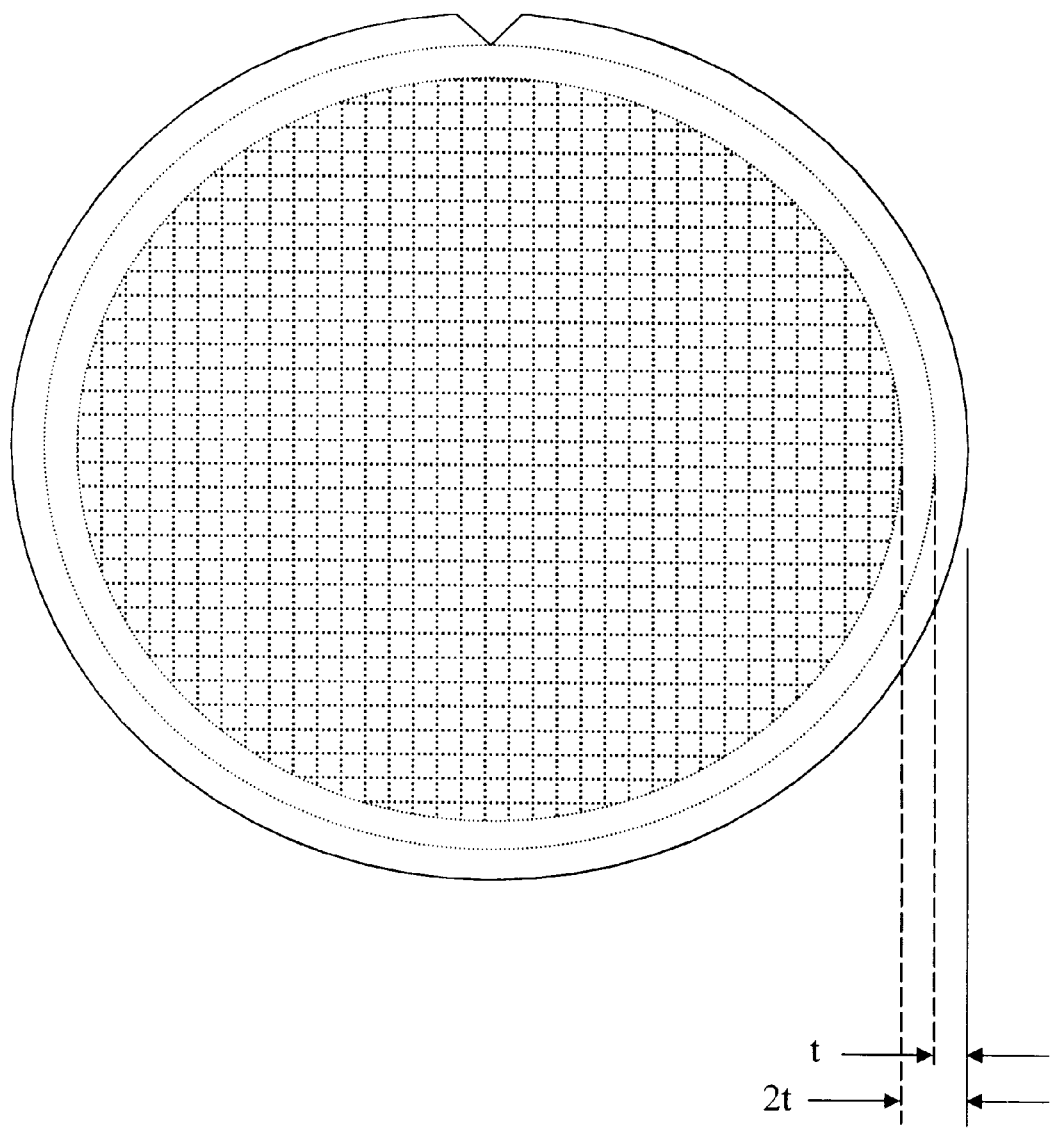

The photoresist is not only coated over the silicon layer, it might also coated beneath the edge of the wafer in process. Hence, an online edge-bead rinsing (EBR) is applied in between the edge of the wafer and a distance t inwardly away from the edge of the wafer, as referring to FIG. 2D, for removing a first portion of the photoresist, as well as a photoresist contamination on the back side of the edge of the wafer. Wherein t is greater than about 1.5 mm. Consequently, sealed by wafer edge exposure (WEE) to expose the portion not covered by the WEE mask. The first portion of the photoresist layer 240 after been removed and having an exposed surface portion of the silicon layer 235 is shown in FIG. 2E.

Figure 2G:
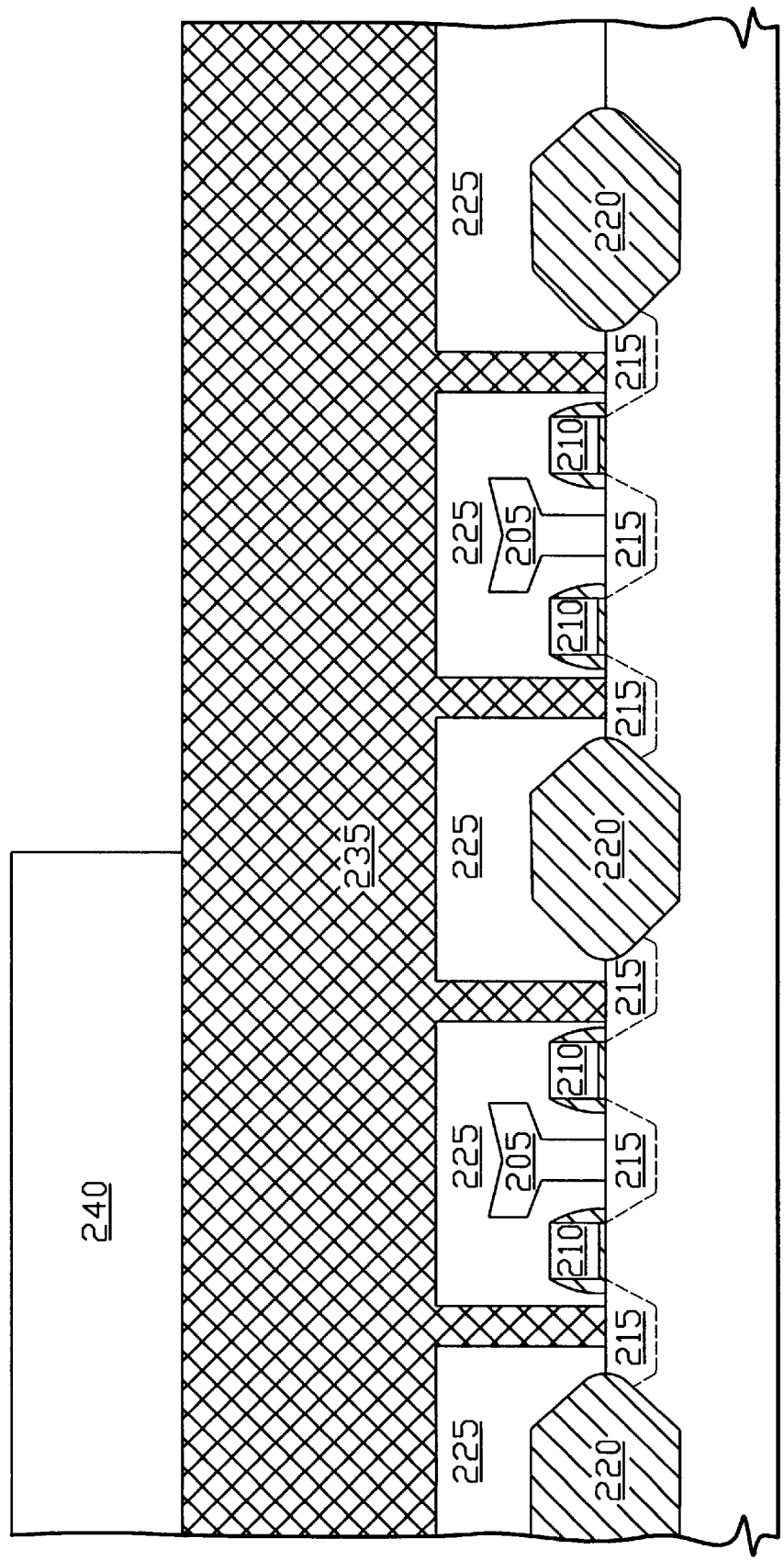

In the embodiment disclosed so far, the edge of the wafer, in particular the photoresist layer, is been rinsed once more to guarantee no capacitor peeling, i.e. no abnormal capacitor formation, in later stages. This particular step is been carried out by an offline EBR, rinsing in between the edge of the wafer and a distance 2t inwardly away from the edge of the wafer, as referring to FIG. 2F, for removing a second portion of the photoresist. Since t is greater than about 1.5 mm, then 2t must be greater than about 3.0 mm. The second and the first portion of the photoresist layer 240 after been removed with exposing a greater portion of the silicon layer 235 are illustrated in FIG. 2G.

Figure 2H:
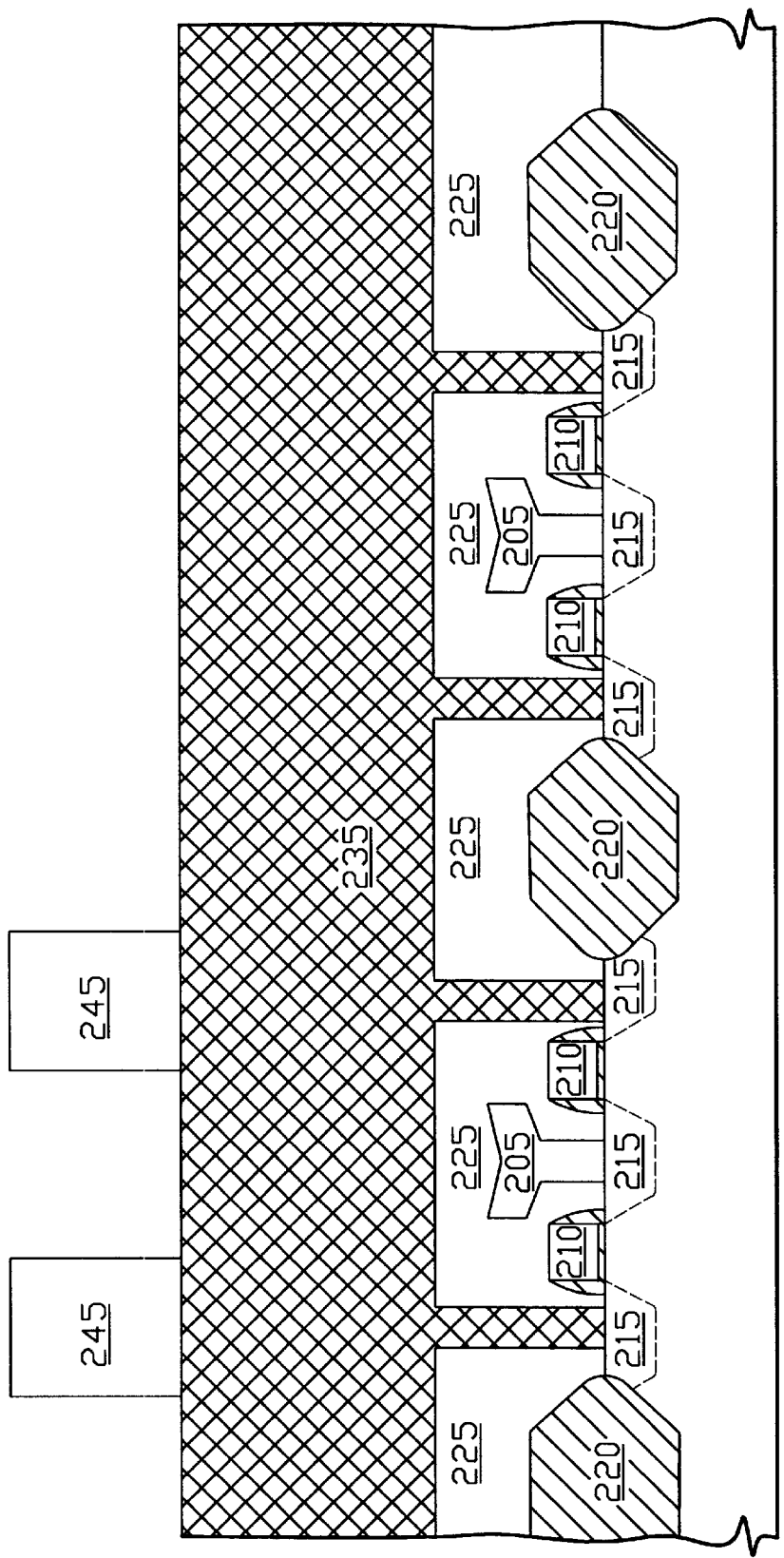
Figure 21:
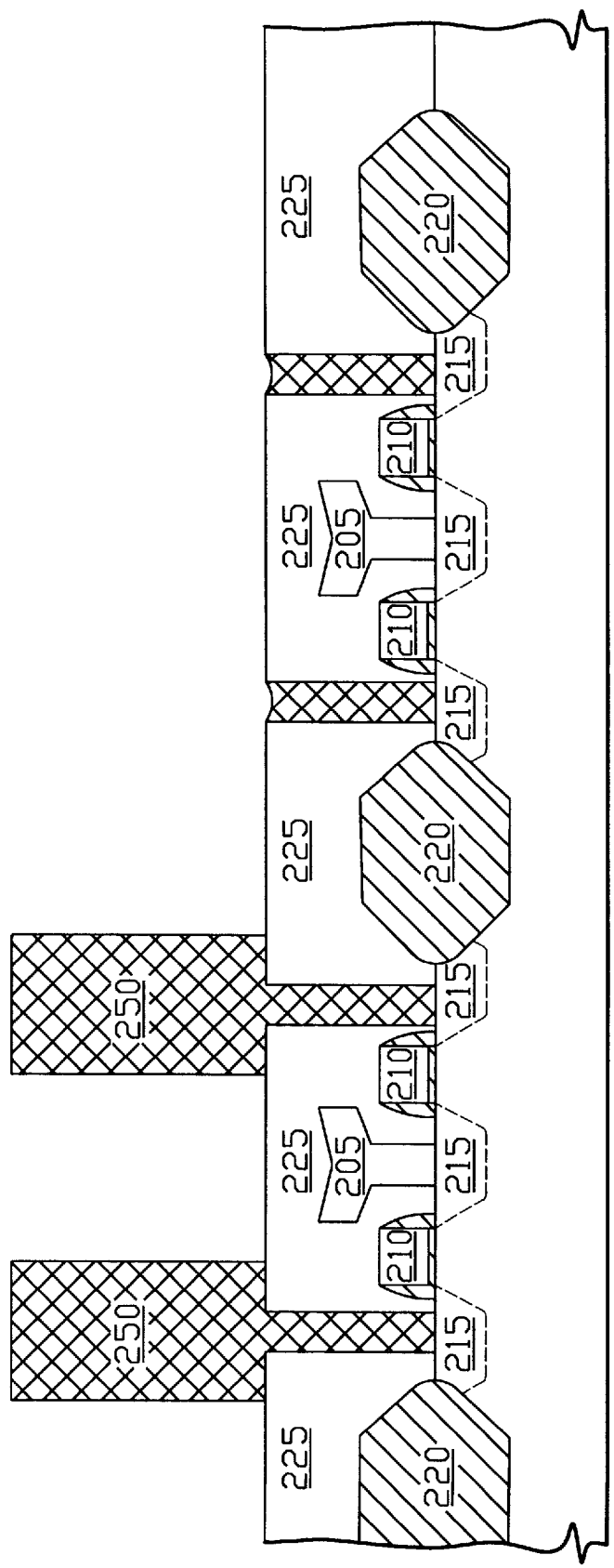

Now referring to FIG. 2H, a photoresist mask 245 for etching the silicon layer 235 is formed on top of the silicon layer. The photoresist mask is conventionally fabricated by creating a photolithographic mask containing a pattern of the defined locations of lower capacitor electrodes for DRAM fabrications. The photoresist layer with the first and the second portion removed is exposed to ultraviolet light through the photolithographic mask to soften or harden parts of the remaining resist depending on whether positive or negative resist is used, removing the softened parts of the resist, and ending up with the photoresist mask 245.

Finally, in FIG. 2I, the silicon layer is wet etched at where it is not covered by the photoresist mask to form a lower capacitor electrode 250 and to expose a portion of the dielectric layer 225. Every single lower capacitor electrode has a unified aspect ratio of about 3.0 or above. Hence, the problem of abnormal capacitor formation is solved and leaving the normal ones. The photoresist mask is stripped as to conclude the embodiment of the present invention.

Although specific embodiments have been illustrated and described, it will be obvious to those skilled in the art that various modifications may be made without departing from what is intended to be limited solely by the appended claims.

What is claimed is:

1. A method for ensuring no capacitor peeling at the edge of a wafer in the fabrication of an integrated circuit device comprising:

providing a substrate having a semiconductor structure formed thereon;

forming an insulating layer overlying said semiconductor structure;

patterning said insulating layer to define a contact window;

depositing a conductive layer over said insulating layer and filling up said contact window;

coating a photoresist layer overlying said conductive layer;

removing a first portion of said photoresist in between said edge of said wafer and a first distance inwardly away from said edge of said wafer;

removing a second portion of said photoresist in between said edge of said wafer and a second distance inwardly away from said edge of said wafer, said second distance is greater than said first distance;

carrying out a photolithography process against said photoresist layer to form a photoresist mask;

etching said conductive layer where it is not covered by said photoresist mask to form a lower capacitor electrode; and removing said photoresist mask.

2. The method in accordance with claim 1, wherein removing said first portion is accomplished by using an online edge-bead rinsing (EBR).

3. The method in accordance with claim 1, wherein removing said second portion is accomplished by using an offline EBR.

4. The method in accordance with claim 1 further comprises a step of wafer edge exposure (WEE) in between removing said first portion and removing said second portion, for exposing said first portion.

5. The method in accordance with claim 1, wherein said first distance is greater than about 1.5 mm.

6. The method in accordance with claim 1, wherein said second distance is greater than about 3.0 mm.

7. The method in accordance with claim 1, wherein said substrate comprises silicon.

8. The method in accordance with claim 1, wherein said semiconductor structure comprises a bit line, a gate electrode, a source/drain region, and an isolation region.

9. The method in accordance with claim 1, wherein said insulating layer comprises silicon dioxide (SiO$_2$).

10. The method in accordance with claim 1, wherein said conductive layer comprises polysilicon.

11. The method in accordance with claim 1, wherein said conductive layer comprises amorphous silicon.

12. The method in accordance with claim 10, wherein said polysilicon layer is formed by using chemical vapor deposition to a thickness greater than about 8000 angstroms.

13. The method in accordance with claim 11, wherein said amorphous silicon layer is formed by using chemical vapor deposition to a thickness greater than about 8000 angstroms.

14. The method in accordance with claim 1, wherein said lower capacitor electrode having an aspect ratio greater than about 3.0.

15. A method for ensuring no capacitor peeling at the edge of a wafer in the fabrication of dynamic random access memory (DRAM) comprising:

providing a semiconductor substrate having a semiconductor structure formed thereon;

forming a dielectric layer overlying said semiconductor structure;

patterning said dielectric layer to define a contact window and to expose a portion of said substrate;

depositing a silicon layer over said dielectric layer and filling up said contact window;

coating a photoresist layer overlying said silicon layer;

rinsing in between said edge of said wafer and a first distance inwardly away from said edge of said wafer for removing a first portion of said photoresist, as well as a photoresist contamination on the back side of said edge of said wafer;

rinsing in between said edge of said wafer and a second distance inwardly away from said edge of said wafer for removing a second portion of said photoresist to avoid abnormal capacitor formation in later stages, said second distance is greater than said first distance;

carrying out a photolithography process against said photoresist layer to form a photoresist mask;

etching said silicon layer where it is not covered by said photoresist mask to form a lower capacitor electrode; and stripping said photoresist mask.

16. The method in accordance with claim 15, wherein rinsing in between said edge of said wafer and said first distance inwardly away from said edge of said wafer is accomplished by using an online edge-bead rinsing (EBR).

17. The method in accordance with claim 15, wherein rinsing in between said edge of said wafer and said second distance inwardly away from said edge of said wafer is accomplished by using an offline EBR.

18. The method in accordance with claim 15 further comprises a step of wafer edge exposure (WEE) in between removing said first portion and removing said second portion, for exposing the portion not covered by a WEE mask.

19. The method in accordance with claim 15, wherein said first distance is greater than about 1.5 mm.

20. The method in accordance with claim 15, wherein said second distance is greater than about 3.0 mm.

21. The method in accordance with claim 15, wherein said semiconductor substrate comprises silicon.

22. The method in accordance with claim 15, wherein said semiconductor structure comprises a bit line, a gate electrode, a source/drain region, and an isolation region.

23. The method in accordance with claim 15, wherein said dielectric layer comprises silicon dioxide ($SiO_2$).

24. The method in accordance with claim 15, wherein said silicon layer comprises polysilicon.

25. The method in accordance with claim 15, wherein said silicon layer comprises amorphous silicon.

26. The method in accordance with claim 24, wherein said polysilicon layer is formed by using chemical vapor deposition to a thickness greater than about 8000 angstroms.

27. The method in accordance with claim 25, wherein said amorphous silicon layer is formed by using chemical vapor deposition to a thickness greater than about 8000 angstroms.

28. The method in accordance with claim 15, wherein said lower capacitor electrode having an aspect ratio greater than about 3.0.

* * * * *